(12) United States Patent
Peterson et al.

(10) Patent No.: US 6,495,895 B1
(45) Date of Patent: Dec. 17, 2002

(54) BI-LEVEL MULTILAYERED MICROELECTRONIC DEVICE PACKAGE WITH AN INTEGRAL WINDOW

(75) Inventors: Kenneth A. Peterson, Albuquerque, NM (US); Robert D. Watson, Tijeras, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 10/062,220

(22) Filed: Feb. 1, 2002

Related U.S. Application Data

(62) Division of application No. 09/571,335, filed on May 16, 2000, now Pat. No. 6,384,473.

(51) Int. Cl.$^7$ .......................................... H01L 31/0203
(52) U.S. Cl. ................ 257/434; 257/686; 257/778; 257/433; 257/432; 257/680; 257/685; 257/777; 257/780; 257/779; 257/784; 257/704; 257/738
(58) Field of Search ................................ 257/434, 686, 257/778, 433, 432, 680, 685, 777, 780, 779, 784, 704, 738

(56) References Cited

U.S. PATENT DOCUMENTS 5,491,362 A * 2/1996 Hamzehdoost et al. ..... 257/675

* cited by examiner

Primary Examiner—David L. Talbott
Assistant Examiner—Luan Thai
(74) Attorney, Agent, or Firm—Robert D. Watson

(57) ABSTRACT

A bi-level, multilayered package with an integral window for housing a microelectronic device. The device can be a semiconductor chip, a CCD chip, a CMOS chip, a VCSEL chip, a laser diode, a MEMS device, or a IMEMS device. The multilayered package can be formed of a low-temperature cofired ceramic (LTCC) or high-temperature cofired ceramic (HTCC) multilayer processes with the window being simultaneously joined (e.g. cofired) to the package body during LTCC or HTCC processing. The microelectronic device can be flip-chip bonded and oriented so that the light-sensitive side is optically accessible through the window. A second chip can be bonded to the backside of the first chip, with the second chip being wirebonded to the second level of the bi-level package. The result is a compact, low-profile package, having an integral window that can be hermetically-sealed.

46 Claims, 8 Drawing Sheets

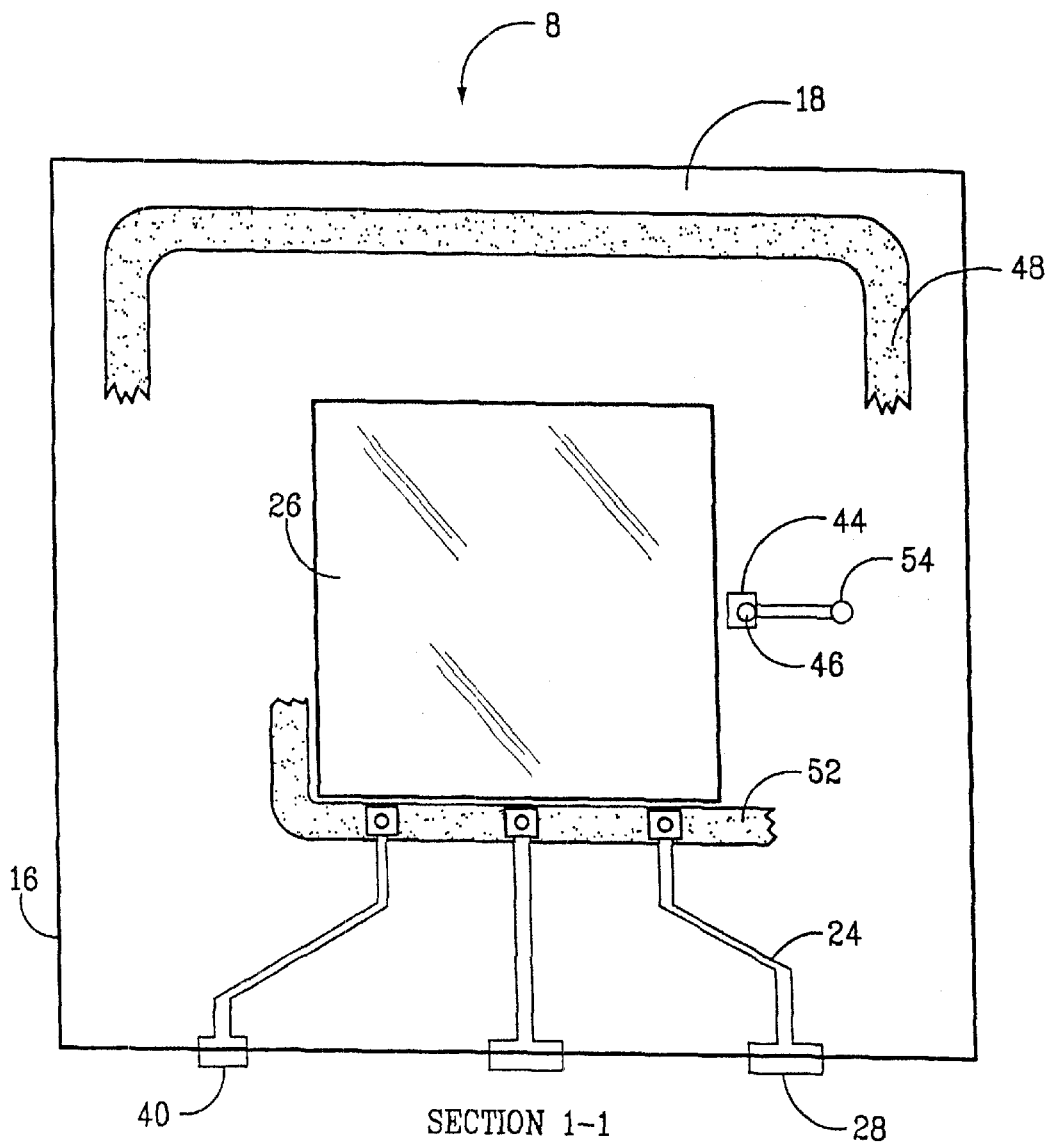

BI-LEVEL MULTILAYERED MICROELECTRONIC DEVICE PACKAGE WITH AN INTEGRAL WINDOW

CROSS-REFERENCE TO RELATED APPLICATIONS

This application is a divisional application of allowed U.S. patent application "Microelectronic Device Package with an Integral Window, Peterson et al., Ser. No. 09/571,335, filed May 16, 2000, now U.S. Pat. No. 6,384,473, which is incorporated herein by reference.

FEDERALLY SPONSORED RESEARCH

The United States Government has rights in this invention pursuant to Department of Energy Contract No. DE-AC04-94AL85000 with Sandia Corporation.

BACKGROUND OF THE INVENTION

The present invention relates generally to the field of microelectronics, and more specifically to packaging of microelectronic devices in a package having an integral window.

Many different types of microelectronic devices require a window to provide optical access and protection from the environment. Examples of optically-interactive semiconductor devices include charge-coupled devices (CCD), photo-sensitive cells (photocells), solid-state imaging devices, and UV-light sensitive Erasable Programmable Read-Only Memory (EPROM) chips. All of these devices use microelectronic devices that are sensitive to light over a range of wavelengths, including ultraviolet, infrared, and visible. Other types of semiconductor photonic devices emit light, such as laser diodes and Vertical Cavity Surface-Emitting Laser (VCSELS), which also need to pass light through a protective window.

Microelectromechanical systems (MEMS) and Integrated MEMS (IMEMS) devices (e.g. MEMS devices combined with Integrated Circuit (IC) devices) can also require a window for optical access. Examples of MEMS devices include airbag accelerometers, microengines, microlocks, optical switches, tiltable mirrors, miniature gyroscopes, sensors, and actuators. All of these MEMS devices use active mechanical and/or optical elements. Some examples of active MEMS structures include gears, hinges, levers, slides, tilting mirrors, and optical sensors. These active structures must be free to move or rotate. Optical access through a window is required for MEMS devices that have mirrors and optical elements. Optical access to non-optically active MEMS devices can also be required for inspection, observation, and performance characterization of the moving elements.

Additionally, radiation detectors which detect alpha, beta, and gamma radiation use "windows" of varying thickness and materials to either transmit, block, or filter these energetic particles. These devices also have a need for windows that transmit or filter radiation to and from the device, while at the same time providing physical and environmental protection.

The word "transparent" is broadly defined herein to include transmission of radiation (e.g. photons and energetic particles) covering a wide range of wavelengths and energies, not just UV, IR, and visible light. Likewise, the word "window" is broadly defined herein to include materials other than optically transparent glass, ceramic, or plastic, such as thin sheets of metal, which can transmit energetic particles (e.g. alpha, beta, gamma, and light or heavy ions).

There is a continuing need in the semiconductor fabrication industry to reduce costs and improve reliability by reducing the number of fabrication steps, while increasing the density of components. One approach is to shrink the size of packaging. Another is to combine as many steps into one by integrating operations. A good example is the use of cofired multilayer ceramic packages. Unfortunately, adding windows to these packages typically increases the complexity and costs.

Hermetically sealed packages are used to satisfy more demanding environmental requirements, such as for military and space applications. The schematic shown in FIG. 1 illustrates a conventional ceramic package for a MEMS device, a CCD chip, or other optically active microelectronic device. The device or chip is die-attached face-up to a ceramic package and then wirebonded to interconnect inside of the package. Metallized circuit traces carry the electrical signal through the ceramic package to electrical leads mounted outside. A glass window is attached as the last step with a frit glass or solder seal. Examples of conventional ceramic packages include Ceramic Dual In-Line Package (CERDIP), EPROM and Ceramic Flatpack designs.

Although stronger, ceramic packages are typically heavier, bulkier, and more expensive to fabricate than plastic molded packages. Problems with using wirebonding include the fragility of very thin wires; wire sweep detachment and breakage during transfer molding; additional space required to accommodate the arched wire shape and toolpath motion of the wirebond toolhead; and the constraint that the window (or cover lid) be attached after the wirebonding step. Also, attachment of the window as the last step can limit the temperature of bonding the window to the package.

FIG. 2 illustrates schematically a conventional molded plastic (e.g. encapsulated) microelectronic package. The chip is attached to a lead frame, and a polymer dam prevents the plastic encapsulant from flowing onto the light-sensitive area of the chip during plastic transfer molding. The window is generally attached with a polymer adhesive. Problems with this approach include the use of fragile wirebonded interconnections; and plastic encapsulation, which does not provide hermetic sealing against moisture intrusion.

Flip-chip mounting of semiconductor chips is a commonly used alternative to wirebonding. In flip-chip mounting the chip is mounted face-down and then reflow soldered using small solder balls or "bumps" to a substrate having a matching pattern of circuit traces (such as a printed wiring board). All of the solder joints are made simultaneously. Excess spreading of the molten solder ball is prevented by the use of specially-designed bonding pads. Flip-chip mounting has been successfully used in fabricating Multi-Chip Modules (MCM's), Chip-on-Board, Silicon-on-Silicon, and Ball, Grid Array packaging designs.

Flip-chip mounting has many benefits over traditional wirebonding, including increased packaging density, lower lead inductance, shorter circuit traces, thinner package height, no thin wires to break, and simultaneous mechanical die-attach and electrical circuit interconnection. Another advantage is that the chips are naturally self-aligning due to surface tension when using molten solder balls. It is also possible to replace the metallic solder bumps with bumps, or dollops, of an electrically-conductive polymer or epoxy (e.g. silver-filled epoxy). Flip-chip mounting avoids potential problems associated with ultrasonic bonding techniques that can impart stressful vibrations to a fragile (e.g. released) MEMS structure.

Despite the well-known advantages of flip-chip mounting, this technique has not been widely practiced for packaging of MEMS devices, Integrated MEMS (IMEMS), or CCD chips because attaching the chip face-down to a solid, opaque substrate prevents optical access to the optically-active, light-sensitive surface.

The cost of fabricating ceramic packages can be reduced by using cofired ceramic multilayer packages. Multilayer packages are presently used in many product categories, including leadless chip carriers, pin-grid arrays (PGA's), side-brazed dual-in-line packages (DIP's), flatpacks, and leaded chip carriers. Depending on the application, 5–40 layers of dielectric layers can be used, each having printed signal traces, ground planes, and power planes. Each signal layer can be connected to adjacent layers above and below by conductive vias passing through the dielectric layers.

Electrically conducting metallized traces, thick-film resistors, and solder-filled vias or Z-interconnects are conventionally made by thick-film metallization techniques, including screen-printing. Multiple layers are printed, vias-created, stacked, collated, and registered. The layers are then joined together (e.g. laminated) by a process of burnout, followed by firing at elevated temperatures. Burnout at 350–600 C. first removes the organic binders and plasticizers from the substrate layers and conductor/resistor pastes. After burnout, these parts are fired at much higher temperatures, which sinters and densities the glass-ceramic substrate to form a dense and rigid insulating structure. Glass-forming constituents in the layers can flow and fill-in voids, corners, etc.

Two different cofired ceramic systems are conventionally used, depending on the choice of materials: high-temperature cofired ceramic (HTCC), and low-temperature cofired ceramic (LTCC). HTCC systems typically use alumina substrates; are printed with molybdenum-manganese or tungsten conducting traces; and are fired at high temperatures, from 1300 C. to 1800 C. LTCC systems use a wide variety of glass-ceramic substrates; are printed with Au, Ag, or Cu metallizations; and are fired at lower temperatures, from 600 C. to 1300 C. After firing, the semiconductor die is attached to the fired HTCC (or LTCC) body; followed by wirebonding. Finally, the package is lidded and sealed by attaching a metallic, ceramic, or glass cover lid with a braze, a frit glass, or a solder seal, depending on the hierarchy of thermal processing and on performance specifications.

Use of cofired multilayer ceramic structures for semiconductor packages advantageously permits a wide choice of geometrical designs and processing conditions, as compared to previous use of bulk ceramic pieces (which typically had to be cut and ground from solid blocks or bars). Ceramic packages with high-temperature seals are generally stronger and have improved hermeticity, compared to plastic encapsulated packages. It is well known to those skilled in the art that damaging moisture can penetrate polymer-based seals over time. Also, metallized conductive traces are more durable than freestanding wire bond segments, especially when the traces are embedded and protected within a layer of insulating material.

In summary, conventional methods and designs for packaging of light-sensitive microelectronic devices attach the window (or cover lid containing a window) after completing the steps of die attachment and wirebonding of the chip or MEMS device to the package. Many processing steps are used, which can expose the fragile MEMS structures to particulate contamination and mechanical damage during packaging.

What is needed is a packaging process that minimizes the number of times that a MEMS device is handled and exposed to temperature cycles and different environments, which can possibly lead to contamination of the device. This can be accomplished by performing as many of the package fabrication steps as possible before mounting the MEMS device. What is needed, then, is a packaging process that attaches the window to the package before mounting the chip to the package. It is also desired that the window be attached to the package body at a high temperature to provide a strong, hermetic bond between the window and the body. What also is needed is a method where the MEMS device faces away from the cover lid, so that contamination is reduced when the cover lid is attached last.

Electrical interconnections from the chip to the package are needed that are stronger and less fragile than conventional wirebonds. What also is needed is a package having a high degree of strength and hermeticity. In some cases, it is also desired to stack back-to-back multiple chips, of different types (e.g. CMOS, MEMS, etc.) inside of a single, windowed-package.

Use of the phrase "MEMS devices" is broadly defined herein to include "IMEMS" devices, unless specifically stated otherwise. The word "plastic" is broadly defined herein to include any type of flowable, dielectric composition, including polymer compounds and spin-on glass-polymer compositions. The phrases "released MEMS structures", "released MEMS elements", and "active MEMS elements" and "active MEMS structures" are used interchangeably to refer to a device having freely-movable structural elements, such as gears, pivots, hinges, sliders, tilting mirrors; and also to exposed active elements such as chemical sensors, flexible membranes, and beams with thin-film strain gauges, which are used in accelerometers and pressure sensors.

BRIEF DESCRIPTION OF THE DRAWINGS

The accompanying drawings, which are incorporated in and form part of the specification, illustrate various examples of the present invention and, together with the description, serve to explain the principles of the invention.

FIG. 7 shows a schematic top view along line 1—1 of FIG. 3A of a sixteenth example of a microelectronic package for housing at least one microelectronic device according to the present invention, illustrating examples of the electrically conducting metallized traces located on the upper surface of the first plate, including interconnect bumps, interior bond pads, exterior bond pads, and a conductive via.

DETAILED DESCRIPTION OF THE INVENTION

The present invention relates to a package for housing at least one microelectronic device, comprising a hollow assembly of stacked, electrically insulating plates and an integral window.

It should be noted that the examples of the present invention shown in the figures are sometimes illustrated with the window facing down, which is the preferred orientation during flip-chip bonding. However, those skilled in the art will understand that the completed package can be oriented for use with the window facing upwards. It should also be noted that all of the figures show only a single microelectronic device, illustrated as a microelectronic device or pair of chips. It is intended that the method and apparatus of the present invention should be understood by those skilled in the art as applying equally to a plurality of chips or devices packaged in a one-dimensional or a two-dimensional array, as in a multi-chip module (MCM), including multiple windowed-compartments, and including having a window on either side of the package.

Figure 1:
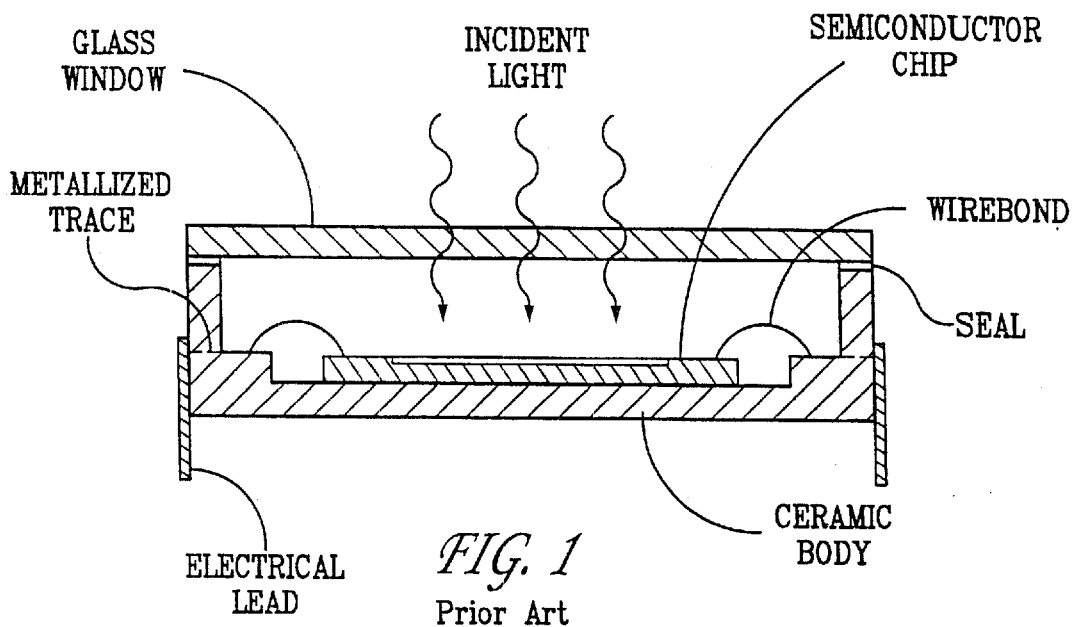
FIG. 1 shows a schematic cross-section view of a conventional ceramic microelectronic package, where the window or cover lid is attached last, after the microelectronic device has been joined (face-up) to the base and wirebonded.
Figure 2:
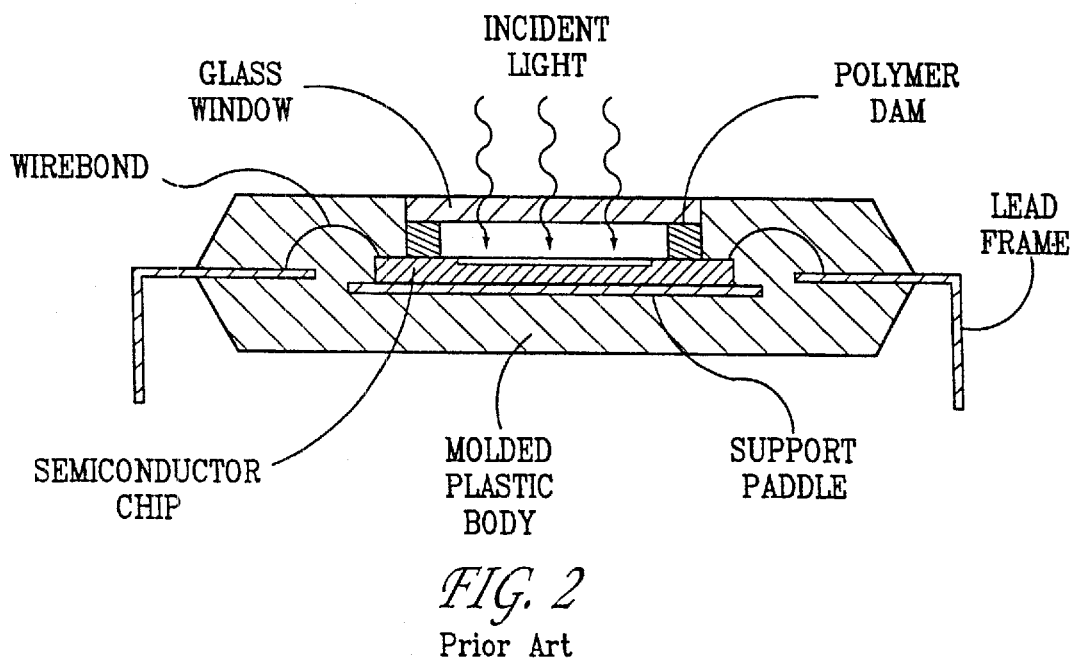
FIG. 2 shows a schematic cross-section view of a conventional plastic molded microeletronic package, where the microelectronic device, lead frame, and window are encapsulated in a plastic body by a transfer molding process.
Figure 3A:
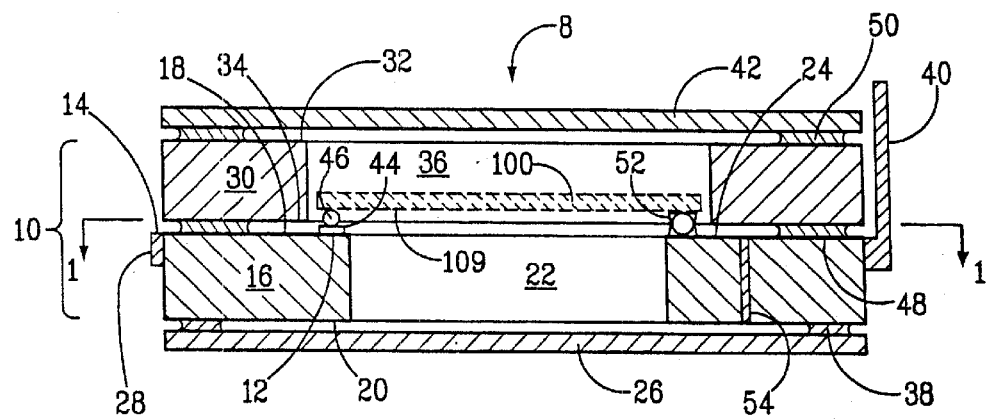
FIG. 3A shows a schematic cross-section view of a first example of a microelectronic package according to the present invention, with the package having an integral window attached to a ceramic body including an first (lower) plate, a second (upper) plate, and an attached cover lid.

FIG. 3A shows a schematic cross-section view of a first example of a microelectronic package 8 for housing at least one microelectronic device according to the present invention, comprising a hollow assembly 10 of stacked, electrically insulating plates. The assembly 10 of FIG. 3A has an interior interconnect location 12 disposed on an interior surface of hollow assembly 10, and an exterior interconnect location 14 disposed on an exterior surface of assembly 10. Assembly 10 further comprises a first plate 16. Plate 16 has a first surface 20, an opposing second surface 18, and a first aperture 22 through plate 16. Plate 16 also has an electrically conductive metallized trace 24 disposed on surface 18, for conducting an electrical signal between. interior interconnect location 12 and exterior interconnect location 14. Plate 16 further comprises a first window 26 bonded to plate 16, for providing optical access to a microelectronic device 100 that could be disposed within assembly 10.

In FIG. 3A, assembly 10 further comprises a second plate 30, which has a third surface 34, an opposing fourth surface 32, and a second aperture 36 through plate 30 for providing physical access to insert device 100 into package 8. Surface 18 of plate 16 is bonded to the surface 34 of plate 30 to form assembly 10. At least one lateral dimension of aperture 36 is slightly larger than the corresponding lateral dimension of aperture 22. Aperture 22 is substantially aligned with aperture 36. The lateral dimensions of aperture 36 are slightly larger than the lateral dimensions of chip or device 100, so that chip or device 100 can fit inside of aperture 36.

In FIG. 3A, window 26 is attached flush to plate 16. The attachment can comprise a first seal 38. Other mounting arrangements will be disclosed later. The shape of aperture 22 and aperture 36 can be polygonal (e.g. square or rectangular) or circular. Aperture 22 can have a different shape than aperture 36. The horizontal surfaces of device 100, plate 16, plate 18, and window 26 all can be substantially coplaner. Microelectronic device 100 can comprise a microelectronic device 100.

In FIG. 3A, microelectronic device 100 can be flip-chip mounted (e.g. flipped facedown, with optically active area 109 of chip or device 100 facing towards window 26) to surface 18 of plate 16. The method of flip-chip mounting is well-known to those skilled in the art. Surface 18 can comprise a bond pad 44 electrically connected to metallized trace 24 at interior interconnect location 12. Microelectronic device 100 can include interconnect bumps pre-attached to chip or device 100. Alternatively, surface 18 can comprise an interconnect bump 46, connected either to metallized trace 24 or to bond pad 44 at interior interconnect location 12. Interconnect bump 46 can comprise an electrically conductive material (e.g. gold, gold alloy, aluminum, solder, and silver-filled epoxy) for electrically connecting chip or device 100 to metallized trace 24 or bond pad 44. Alternatively, bump 46 can comprise a non-conducting, adhesive material (e.g. epoxy resin, polyimide, silicone, or urethane) for providing mechanical attachment of chip or device 100 to surface 18.

In FIG. 3A, package 8 can include a bond pad 28 attached to assembly 10 at exterior interconnect location 14. Bond pad 28 can be electrically connected to metallized trace 24. Package 8 can also include an electrical lead 40 attached to assembly 10 at exterior interconnect location 14. Lead 40 can be electrically connected to metallized trace 24. Optionally, lead 40 can be attached to bond pad 28. Assembly 10 can also comprise an electrically conductive via 54, which can be in electrical communication with metallized trace 24. Via 54 can be oriented perpendicular to surface 18, and can be disposed from surface 18 to surface 16. Via 54 can be made electrically conducting by filling hole 54 with solder or other flowable, electrically conducting material.

In FIG. 3A, assembly 10 can include a cover lid 42 attached to surface 32 of plate 30. Attachment of cover lid 42 can complete the packaging of semiconductor chip or device 100 inside of a sealed package 8. Cover lid 42 can include a second window (not shown in FIG. 3A), for providing optical access through aperture 36. Optionally, the ambient air inside of sealed package 8 can be substantially removed before attaching cover lid 42, and replaced with at least one gas other than air. This other gas can include an inert gas (e.g. argon, nitrogen, or helium). Helium can be easily detected by a conventional helium leak detector, thereby providing information on the hermetic quality of the joints and seals in package 8. The level of humidity can also be adjusted prior to sealing package 8 with cover lid 42.

In FIG. 3A, plate 16 is attached to plate 18. This attachment can comprise a second seal 48 disposed in-between surface 18 and surface 34. Seal 48 can have an annular shape. Likewise, the attachment between cover lid 42 and plate 30 can comprise a third seal 50. Seal 50 can also have an annular shape. The bonding material used for either seals 38, 48 or 50 can comprise a hermetic sealant (e.g. a braze alloy, a frit glass compound, a glass-ceramic composite, a glass-polymer compound, a ceramic-polymer compound, or a solder alloy) or an adhesive material (e.g. an epoxy resin, a polyimide adhesive, a silicone adhesive, or a urethane adhesive). Selection of a particular material for seal 38, 48 or 50 should take into consideration the hierarchy of thermal processing for the entire packaging process. Here, "thermal hierarchy" means that the highest temperature processes (e.g. sintering, joining, etc.) are performed first, followed by progressively lower temperature processes, with the lowest temperature process being performed last in the sequence of fabrication steps.

Window 26 can comprise an optically transparent material (e.g. a borosilicate glass, a quartz glass (i.e. fused silica), a low-iron, a leaded glass, a tempered glass, a low thermal-expansion glass, or a transparent ceramic, such as sapphire). Alternatively, a transparent plastic or polymer-based material can be used (e.g. PMMA). Some plastics are transparent in the UV spectrum. Silicon can be used for windows that are transparent in the IR spectrum. Preferably, the window's coefficient of thermal expansion (CTE) is about equal to the CTE of plate 16. Alternatively, the mismatch in CTE between window 26 and plate 16 can be chosen avantageously so that window 26 is placed in compression. Window 26 can optionally comprise optical quality properties (e.g. purity, flatness, and smoothness).

Window 26 can comprise means for filtering selected wavelengths of light. Coloring dyes, or other elements, can be added to the glass or plastic formulations to form windows that can filter light, as is well-known to the art. Anti-reflection coatings can be applied to the surface or surfaces of window 26 to reduce reflection and/or increase transmission. Also, surface treatments (e.g. thin-film coatings or controlled surface roughness) can be applied to the periphery of window 26 in order to improve the wettability of molten solders and brazes, and to improve the adhesion of window 26 to plate 16. The same surface treatments can also be applied to the mating surfaces of other pairs of surfaces to be joined, including plates 16 and 30, and cover lid 42. Window 26 can also be made of a metal or metal alloy, for use in packaging of a microelectronic device used for detecting energetic particles.

In FIG. 3A, assembly 10 includes plates comprising an electrically insulating material (e.g. a ceramic, a polymer, a plastic, a glass, a glass-ceramic composite, a glass-polymer composite, a resin material, a fiber-reinforced composite, a glass-coated metal, or a printed wiring board composition) well-known to the art. The ceramic material can comprise alumina, beryllium oxide, silicon nitride, aluminum nitride, titanium nitride, titanium carbide, or silicon carbide. Fabrication of ceramic parts can be performed by processes well-known to the art (e.g. slip casting, machining in the green state, cold-isostatic pressing (CIP) followed by hot-isostatic pressing (HIP) or sintering, and uniaxially hot/cold pressing, or rapid forging). Fabrication of plastic and polymer parts can be performed by processes well-known to the art (e.g. transfer molding, injection molding, and machining of printed wiring board (PWB) sheets).

For severe environments, ceramic packages are generally stronger and more hermetic than plastic encapsulated packages. The preferred construction of a microelectronic package with an integral window can use cofired ceramic multilayers. The multiple, stacked ceramic layers are formed by casting a blend of ceramic and glass powders, organic binders, plasticizers, and solvents into sheets or tapes. The organic components provide strength and flexibility to the green (unfired) sheets during substrate personalization and fabrication. Burnout at a relatively low temperature (e.g. 350–600 C.) removes the organic binders and plasticizers from the substrate layers and conductor/resistor pastes. After burnout, these parts are fired at much higher temperatures, which sinters and densifies the glass-ceramic substrate to form a dense, rigid, insulating structure. Glass-forming constituents in the layers can flow and avantageously fill-in voids, corners, etc.

Two different cofired ceramic systems are conventionally used, depending on the choice of materials: high-temperature cofired ceramic (HTCC), and low-temperature cofired ceramic (LTCC). If the ratio of ceramic to glass is high (9/1, or greater), the green substrate layer can only be sintered (e.g. densified) at high firing temperatures (e.g.

1300 to 1800 C.). Consequently, the thick-film pastes (e.g. to form metallized trace 24) that are typically cofired with the substrate also have to withstand these high temperatures, such as tungsten, or alloys of molybdenum and manganese. The dielectric consists of glass fillers in a ceramic matrix. This system is referred to as HTCC. Alternatively, the dielectric can be a ceramic-filled glass matrix, which can be sintered at much lower firing temperatures (e.g. 600 C. to 1300 C.). Thick-film metallization can comprise high-conductivity metals, such as gold, silver, copper, silver-palladium, and platinum-gold. This system is referred to as LTCC.

If hermetic packaging is not required, then polymer-based materials can be used. Multilayer printed wiring board (PWB) materials can be used for constructing assembly 10. In this system, metallized trace 24 is fabricated by using an etched-foil process, well-known to those skilled in the art. Similar to cofired ceramic multilayers, the multiple layers of PWB composition are stacked and laminated under pressure and temperature in a single bonding step (e.g. co-bonded) to form a multilayered assembly 10.

Figure 3B:
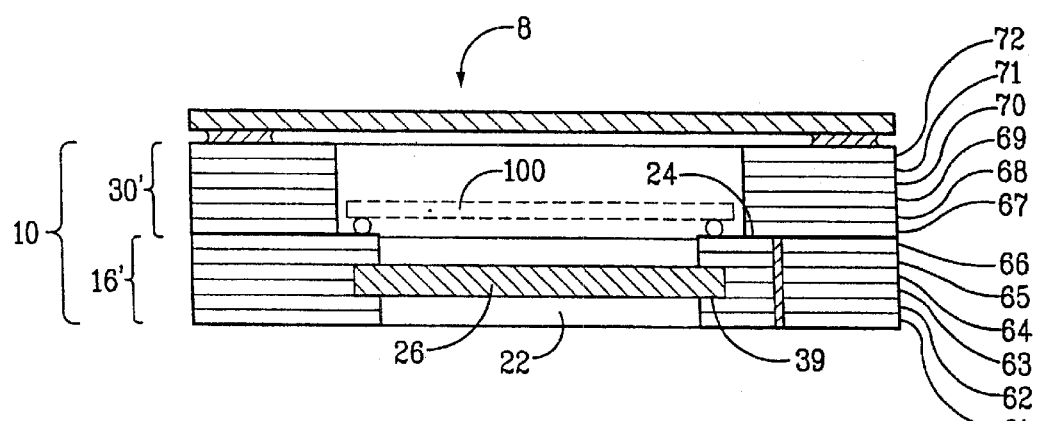
FIG. 3B shows a schematic cross-section view of the second example of a microelectronic package according to the present invention, with the package having an integral window cofired with a cofired multilayered assembly of twelve individual layers, and an attached cover lid.

FIG. 3B shows a schematic cross-section view of a second example of a microelectronic package 8 for housing at least one microelectronic device according to the present invention, comprising a hollow assembly 10 of stacked, electrically insulating plates comprising multiple layers of ceramic tape stacked and laminated under simultaneous pressure and temperature (e.g. cofiring) to form a multi-layered cofired ceramic assembly 10. Such a construction technique readily accommodates the preferred stepped interior-surface profile, as required to hold window 26 and chip or device 100, since the individual layers are easily punched-out or cut (e.g. via a laser, water-jet, or mechanical press) into shapes of varying sizes that can be stacked and cofired to form multi-layered cofired.ceramic assembly 10. For example, FIG. 3B shows an arrangement for integrating window 26 into first plate 16 comprising an encased joint geometry 39 (where the edges of window 26 are embedded inside plate 16). If a bulk ceramic plate were used, it would be very difficult to manufacture such a reentrant, recessed feature for housing window 26 therein. However, by using a laminated, multilayered construction, this is relatively easy to do.

In FIG. 3B, assembly 10 comprises twelve individual layers of ceramic tape stacked and laminated to form a monolithic, unitized body having an integral window 26. The part of assembly 10 grouped as plate 16' comprises six individual layers (e.g. sheets) of glass-ceramic tape (e.g. layers 61, 62, 63, 64, 65, and 66). Likewise, the part of assembly 10 grouped as plate 30' comprises six additional individual layers (e.g. layers 67, 68, 69, 70, 71, and 72). Each layer can be individually personalized with the appropriate inside and outside dimensions. Metallized trace 24 can be deposited on the upper surface of layer 66 (corresponding to surface 18 of FIG. 3A) prior to stacking of the individual layers. Window 26 can be inserted into the stack of layers after the surrounding layers 61, 62, 63, and 64 have been stacked and registered. The remaining eight layers (e.g. 65–72) can be stacked and registered after window 26 has been inserted. Then, the entire stack of twelve layers (e.g. 61–72) can be clamped and fired at the appropriate temperature and pressure for the required time to form a unitized, monolithic body including an integral window 26.

In FIG. 3B, it is not necessary to join plate 16' to plate 30' with a separate seal 48 because this joint is made simultaneously with all of the other layers during the cofiring or co-bonding process.

Those skilled in the art will understand that other thicknesses for plates 16' and 30' can be formed by laminating a different number of layers of the cofired ceramic multilayered material (or co-bonded PWB material). For example, the third example shown in FIG. 4A of the present invention illustrates an example where plate 16' comprises a fewer number of layers (e.g. two layers: 63 and 64). In this case, aperture 22 is substantially filled up by window 26. In this case, window 26 can be: fabricated integrally with plate 16' by casting molten glass, or by molding a liquid polymer, directly into aperture 22.

Figure 4A:
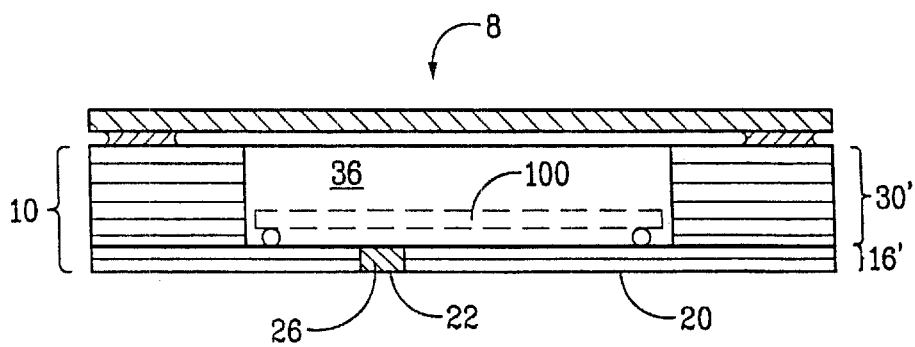
FIG. 4A shows a schematic cross-section view of a third example of a microelectronic package according to the present invention that is similar to the second example of FIG. 3B, but with a cofired window substantially filling up the aperture through the first plate.

In the example shown in FIG. 4A, the size of aperture 22 (and, hence, window 26) is much smaller than the size of chip or device 100. It is not required that the size of window 26 be similar to the size of aperture 22. Also, the example of FIG. 4A shows that the centerline of aperture 22 does not align with the centerline of aperture 36, e.g. aperture 22 is offset from aperture 36. It is not required that aperture 22 be aligned with aperture 36. However, aperture 22 can be substantially aligned with aperture 36. Those skilled in the art will understand that more than one small aperture 22 can be included in plate 16', for providing multiple locations for providing optical access to chip or device 100.

Figure 4B:
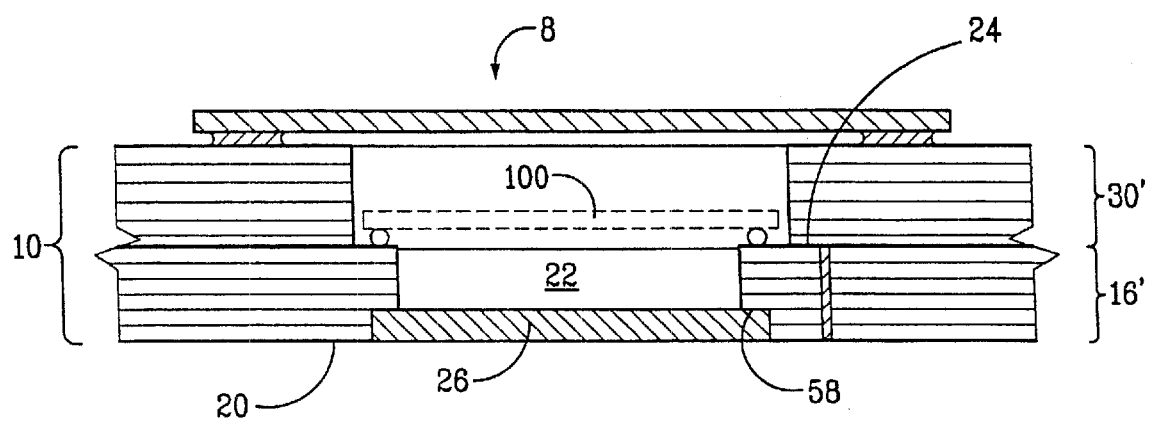
FIG. 4B shows a schematic cross-section view of a fourth example of a microelectronic package according to the present invention that is similar to the second example of FIG. 3B, but with a cofired window mounted to a recessed lip located inside of the first plate, recessed from the second surface of the first plate.

FIG. 4B shows a schematic cross-section view of a fourth example of a microelectronic package 8 for housing at least one microelectronic device according to the present invention, that is similar to the second example of FIG. 3B, but with window 26 attached to recessed lip 58 formed inside of plate 16', wherein the lip can be recessed away from second surface 20 of first plate 16'. Recessed lip 58 can be easily formed by using a cofired multilayered construction, as described previously. FIG. 4B also illustrates that plates 16' and 30' can extend laterally an unlimited distance beyond the immediate material surrounding apertures 22 and 36.

Alternatively, the width of plates 16' and 30' can be limited to extending only a short distance beyond the apertures 22 and 36, as illustrated in FIG. 4A. In this example, plates 16' and 30' can be considered to be a frame for a package that might be housing a single device or chip.

Figure 4C:
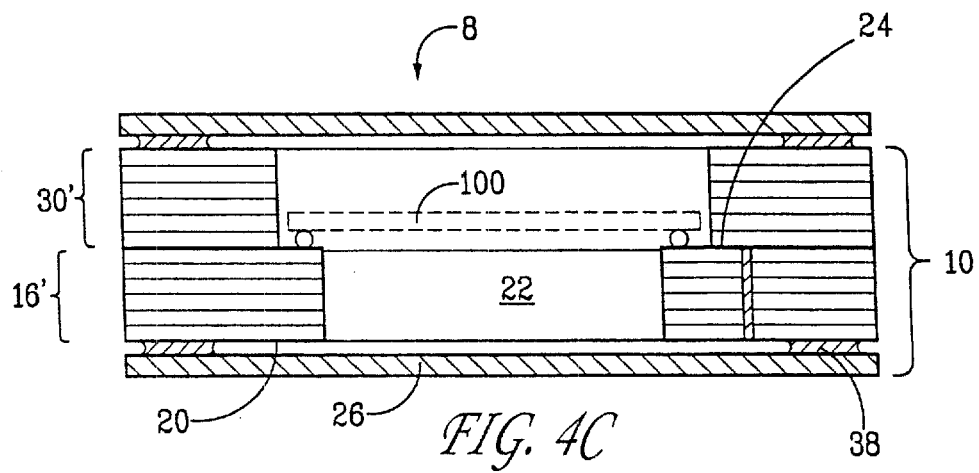
FIG. 4C shows a schematic cross-section view of a fifth example of a microelectronic package according to the present invention that is similar to the second example of FIG. 3B, but with a window mounted flush to the bottom surface of the first plate.

FIG. 4C shows a schematic cross-section view of a fifth example of a microelectronic package 8 for housing at least one microelectronic device according to the present invention that is similar to the second example of FIG. 3B, but with window 26 attached flush to second surface 20 of first plate 16'. Window 26 can be attached to plate 16' with seal 38. Seal 38 can comprise a hermetic sealant material or an adhesive material, as described previously. Alternatively, window 26 can be cofired integrally with plates 16' and 30'.

Figure 5:
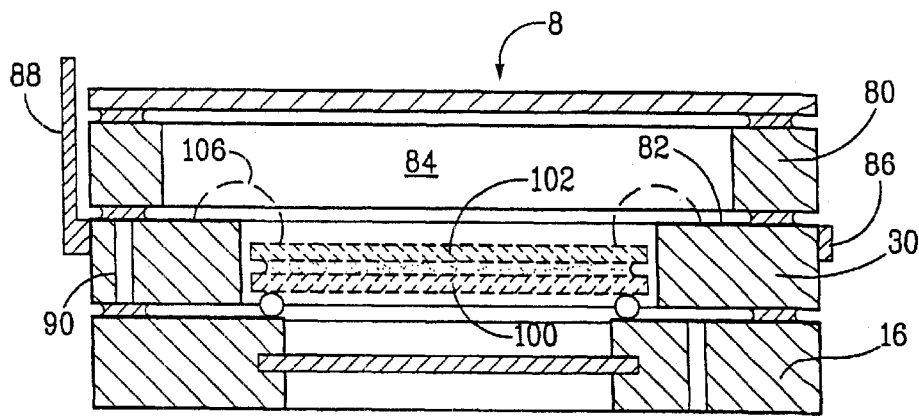
FIG. 5 shows a schematic cross-section view of a sixth example of a microelectronic package according to the present invention, with the package having an integral window cofired to a cofired multilayered assembly including an first (bottom) plate, a second (middle) plate, a third (top) plate, and an attached cover lid, for packaging a pair of stacked chips, including a MEMS chip flip-chip mounted to the first plate, and a second chip attached to the backside of the MEMS chip, wirebonded to the second plate.

FIG. 5 shows a schematic cross-section view of a sixth example of a microelectronic package 8 for housing at least one microelectronic device according to the present invention, that is similar to the first example of FIG. 3A; wherein assembly 10 further comprises a second electrically conductive metallized trace 82 disposed on third surface 34 of plate 30; and a third plate 80 bonded to third surface 34, wherein plate 80 includes a third aperture 84 through plate 80; and further wherein at least one lateral dimension of aperture 84 is slightly larger than the corresponding lateral dimension of aperture 36; and wherein aperture 84 is substantially aligned with aperture 36. Assembly 10 can further comprise a second bond pad 86 or second electrical lead 88 attached to metallized trace 82. Assembly 10 can further comprise a second solder-filled via 90, vertically disposed inside plate 30. Those skilled in the art will understand that additional plates having apertures and metallized traces can be stacked on top of previous plates, to construct as many levels as is needed.

Figure 6A:
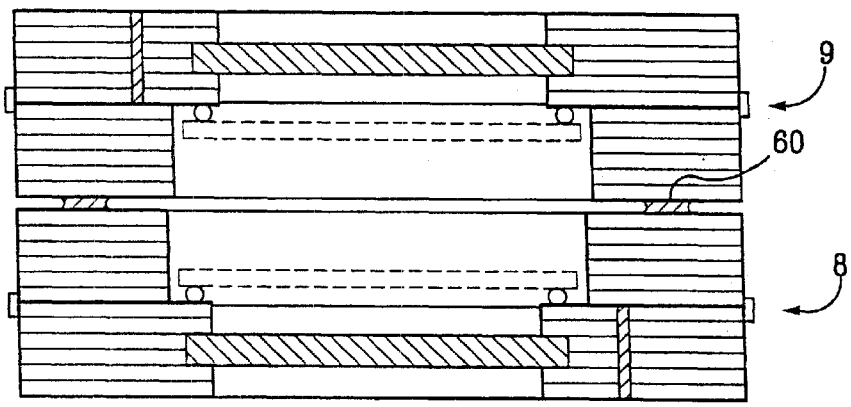
FIG. 6A shows a schematic cross-section view of a seventh example of a microelectronic package according to the present invention that is similar to the first example of FIG. 3A, but with the cover plate removed, and also having a second package, substantially identical to the first example of FIG. 3A (also without a cover plate), where the second package has been inverted and joined to the first package, thereby forming a substantially symmetric package.

FIG. 6A shows a schematic cross-section view of a seventh example of a microelectronic package 8 for housing at least one microelectronic device according to the present invention; further comprising a second package 9 that is substantially identical to the first example of package 8 in FIG. 3A, wherein second package 9 can be inverted and bonded with seal 60 to package 8 to form a sealed, symmetric package capable of housing at least two microelectronic devices. In this example, second package 9 serves the function of cover lid 42 (e.g. to cover and seal package 8).

Figure 6B:
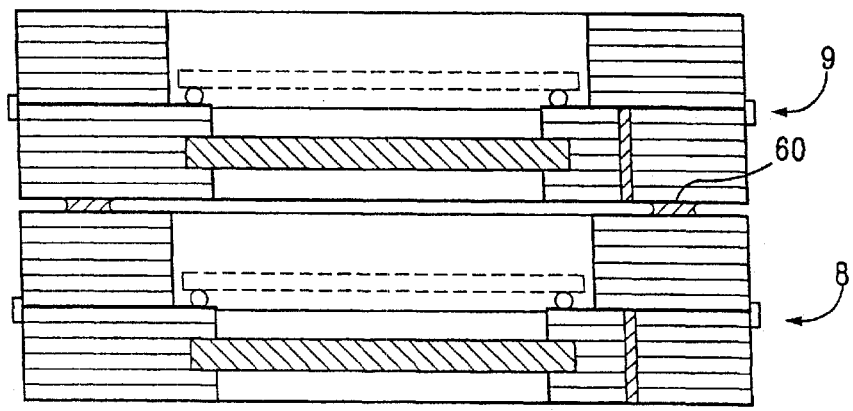
FIG. 6B shows a schematic cross-section view of an eighth example of a microelectronic package according to the present invention that is similar to the first example of FIG. 3A, but with the cover plate removed, and also having a second package, substantially identical to the first example of FIG. 3A (also without a cover plate), where the second package has been stacked above the first package and joined to the first package, thereby forming a stacked, double-package.

FIG. 6B shows a schematic cross-section view of an eighth example of a microelectronic package 8 for housing at least one microelectronic device according to the present invention; further comprising a second package 9 that is substantially identical to the first example of package 8 in FIG. 3A, wherein second package 9 can be stacked and bonded with seal 60 to package 8 to form a stacked double-package capable of housing at least two microelectronic devices.

Figure 6C:
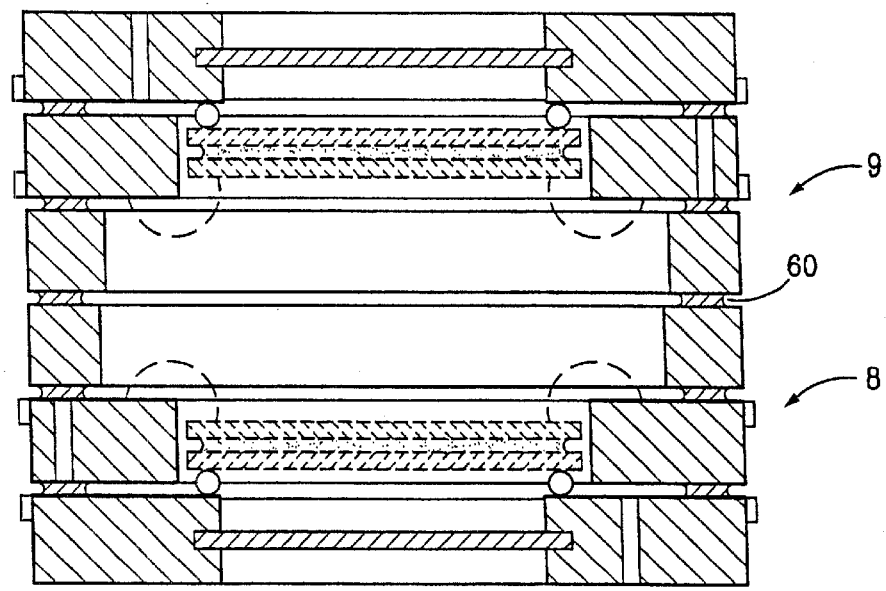
FIG. 6C shows a schematic cross-section view of a ninth example of a microelectronic package according to the present invention that is similar to the sixth example of FIG. 5, but with the cover plate removed, and also having a second package, substantially identical to the first example of FIG. 5 (also without a cover plate), where the second package has been inverted and joined to the first package, thereby forming a substantially symmetric package.

FIG. 6C shows a schematic cross-section view of a ninth example of a microelectronic package 8 for housing at least one microelectronic device according to the present invention; further comprising a second package 9 that is substantially identical to the sixth example of package 8 in FIG. 5, wherein second package 9 can be inverted and bonded with seal 60 to package 8 to form a sealed, symmetric package capable of housing at least four microelectronic devices. In this example, second package 9 serves the function of cover lid 42 (e.g. to cover and seal package 8).

Figure 6D:
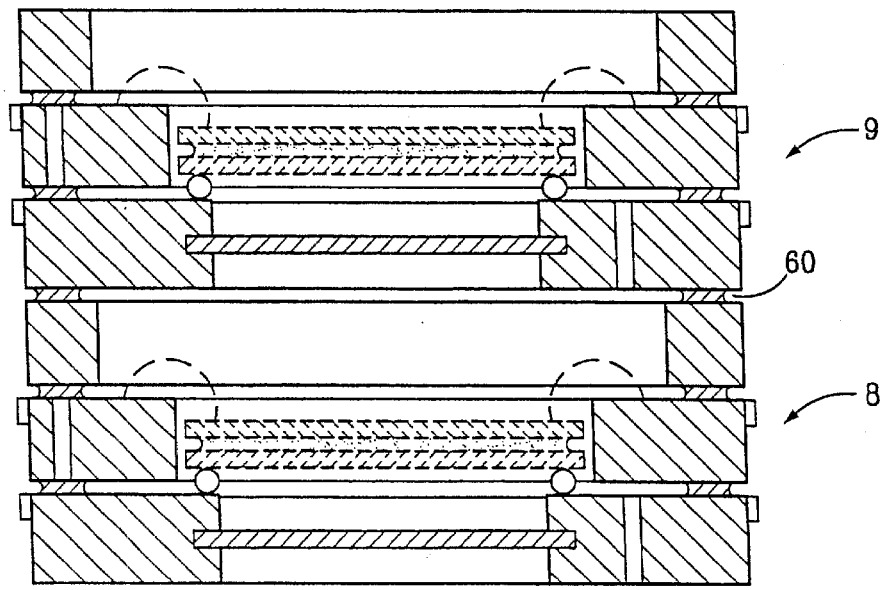
FIG. 6D shows a schematic cross-section view of a tenth example of a microelectronic package according to the present invention that is similar to the first example of FIG. 5, but with the cover plate removed, and also having a second package, substantially identical to the first example of FIG. 5 (also without a cover plate), where the second package has been stacked above the first package and joined to the first package, thereby forming a stacked, double-package.

FIG. 6D shows a schematic cross-section view of a tenth example of a microelectronic package 8 for housing at least one microelectronic device according to the present invention; further comprising a second package 9 that is substantially identical to the sixth example of package 8 in FIG. 5, wherein second package 9 can be stacked and bonded with seal 60 to package 8 to form a stacked double-package capable of housing at least four microelectronic devices.

In an eleventh example of a microelectronic package 8 for housing at least one microelectronic device according to the present invention, that is similar to the first example of FIG. 3A; package 8 further comprises a microelectronic device 100 mounted within assembly 10. Chip or device 100 can be attached to surface 18. Chip or device 100 can be flip-chip mounted via interconnect bump 46 to metallized trace 24. Chip or device 100 can comprise a light-sensitive chip or device (e.g. CCD chip, photocell, laser diode, optical-MEMS, or optical-IMEMS device). Light-sensitive chip or device 100 can be mounted with a light-sensitive side 109 facing towards window 26. An optional seal 52 can be made between chip or device 100 and first surface 18 of plate 16, after flip-chip bonding has been performed. Seal 52 can have an annular shape. Seal 52 can provide protection from particulate contamination of the optically active face of chip or device 100 (e.g. active MEMS structures), as well as a second layer of environmental protection in addition to third seal 50.

In a twelfth example of a microelectronic package 8 for housing at least one microelectronic device according to the present invention, that is similar to the sixth example of FIG. 5; package 8 further comprises a pair of microelectronic devices, 100 and 102, mounted within assembly 10. Chip or device 100 can be attached to surface 18. Chip or device 100 can be flip-chip mounted via interconnect bump 46 to metallized trace 24. Second chip or device or device 102 can be bonded to the backside of chip or device 100 with bond 104. Methods for bonding chips or devices back-to-back include anodic bonding, gold-silicon eutectic bonding, brazing, soldering, and polymer-adhesive attachment. Assembly 10 can further comprise a wirebonded electrical lead 106, electrically attached to metallized trace 82 and to chip or device 102. Chip or device 102 can include a second light-sensitive side 110 mounted face-up, e.g. facing towards cover lid 42. Although not illustrated, cover lid 42 can be attached to assembly 10 using a recessed lip similar to the recessed lip 58 shown in FIG. 4B. Cover lid 42 can be made of a transparent material. Cover lid 42 can also comprise a cofired ceramic multilayered material, which includes a cofired integral window.

Figure 10:
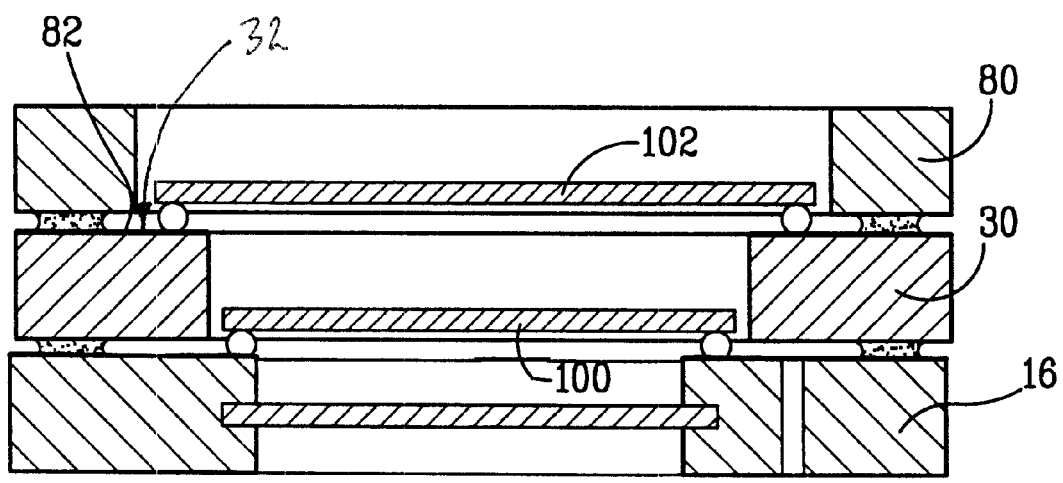
FIG. 10 shows a schematic cross-section view of a thirteenth example of a microelectronic package according to the present invention.

FIG. 10 shows a schematic cross-section view of a thirteenth example of a microelectronic package 8 for housing at least one microelectronic device according to the present invention, that is similar to the sixth example of FIG. 5; package 8 further comprises a pair of microelectronic devices, 100 and 102, mounted within assembly 10. Second chip or device 102 can be flip-chip mounted to metallized trace 82 disposed on surface 32.

In a fourteenth example of a microelectronic package 8 for housing at least one microelectronic device according to the present invention, that is similar to the ninth example of FIG. 6A; package 8 further comprises a pair of microelectronic devices, 100 and 102, mounted within assembly 10. In this example, cover lid 42 includes a second window 108 for providing optical access to light-sensitive side 110 of chip or device 102.

Optional exterior electrical connections 112 can easily be made on the exterior surface of assembly 10, to provide means for conducting electrical signals between chip or device 100 and chip or device 102, as needed.

In a fifteenth example of a microelectronic package 8 for housing at least one microelectronic device according to the present invention, that is similar to the ninth example of FIG. 6C; package 8 further comprises a first pair of chips or devices, joined to each other back-to-back, and mounted to a first package 8, and a second pair of chips or devices, joined to each other back-to-back, and mounted to a second package 9, wherein the second package 9 is inverted and bonded to the first package 8 (as in FIG. 6C). In this example, a combination of flip-chip and wirebonded interconnects can be used for interconnecting the chips or devices to the four different levels of metallized circuit traces. Also, each of the four chips or devices can comprise optically-active elements, including MEMS structures, thereby providing the possibility of passing an optical signal through both apertures by direct transmission, or by conversion of optical signals to electrical, and back to optical via the optically-active chips or devices. This can be accomplished, in part, by using exterior connections in-between the, four different levels of traces 24.

FIG. 7 shows a schematic top view along line 1—1 of FIG. 3A of a sixteenth example of a microelectronic package 8 for housing at least one microelectronic device according to the present invention. Multiple metallized traces can fan out from a smaller pitch to a larger pitch on the periphery of plate 16. Seals 48 and 52 can have the shape of an annular ring.

Figure 8:
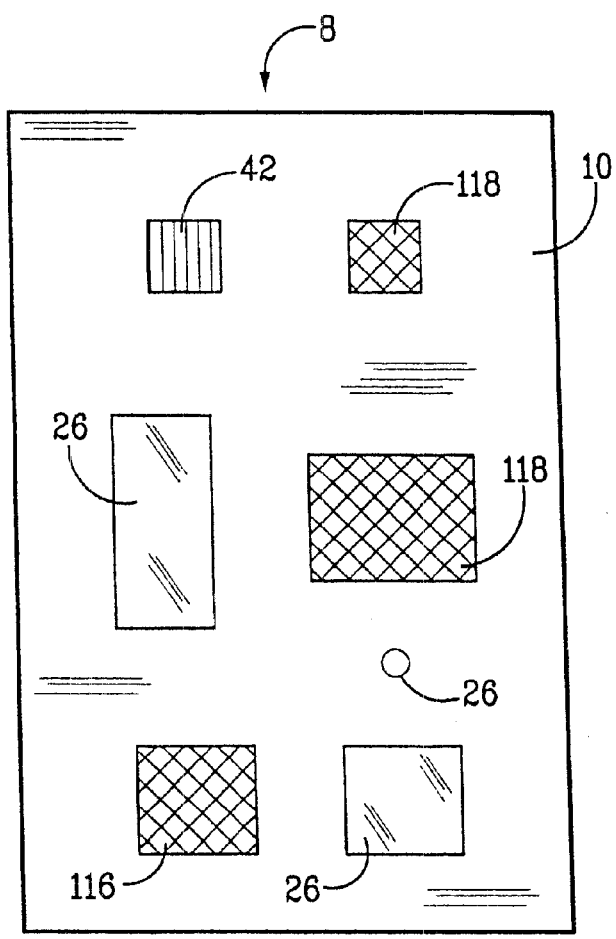
FIG. 8 shows a schematic top view of a seventeenth example of a microelectronic package for housing at least one microelectronic device according to the present invention, wherein the package can be a multi-chip module (MCM), including multiple integral windows and multiple microelectronic devices in a two-dimensional array.

FIG. 8 shows a schematic top view of a seventeenth example of a microelectronic package 8 for housing at least one microelectronic device according to the present invention, wherein package8 can be a multi-chip module (MCM) having a two-dimension array of microelectronic devices. In this example, package 8 includes three compartments having an integral window 26. These windows can be LTCC or HTCC cofired simultaneously along with the rest of the package. Additional microelectronic devices 116 and microelectronic components 118 (e.g. capacitors, resistors, IC's) can be surface mounted to package 8 by conventional techniques, including flip-chip bonding and wirebonding. Cofired windows 26 and/or cover lids 42 can be placed on either side, or both, of the MCM package 8. Multiple light-sensitive chips or devices can be mounted inside of the multiple windowed compartments.

Figure 9:
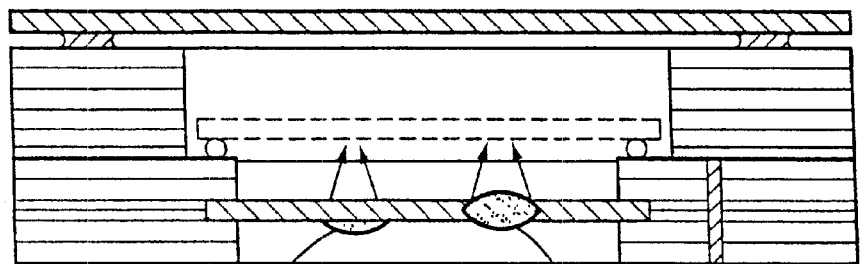
FIG. 9 shows a schematic side view of a eighteenth example of a microelectronic package for housing at least one microelectronic device according to the present invention, wherein the window further comprises a lens for optically transforming light passing through the window.

FIG. 9 shows a schematic side view of a eighteenth example of a microelectronic package 8 for housing at least one microelectronic device according to the present invention, wherein window 26 further comprises a lens 96 for optically transforming light passing through the window. Lens 96 can be used for focusing or concentrating light onto a smaller, or specified, area on chip or device 100. Lens 96 can be formed integrally into window 26, or can be attached separately to the surface of window 26, as in lens 98. More than one lens 96 could be integrated with window 26, with each lens having different optical properties. Alternatively, a divergent lens 96 can be used to spread the light.

Alternatively, the example of FIG. 9 can comprise an array of binary optic lenslets made integral with the window 26. Binary optics technology is the application of semiconductor manufacturing methods to the fabrication of optics. A lens or lens array is laid out on a computer CAD program and transferred to a photo-mask using an e-beam or other writing process. A series of photo-masks are used, in conjunction with various etch steps, to build up the structures of interest. This fabrication technique can be used to make arrays of lenses with 1 micron features in completely arbitrary patterns. Lenslet arrays are straightforward to make with these methods, and can be extremely high quality with no dead space between elements. The advantage of binary optics is that the optical fabrication is not limited to spheres and simple surfaces. Lenslet arrays can be effectively used to performing optical remapping, such as transforming a round aperture into a square pupil. More details on the utility and methods for fabricating binary optic lenslet arrays can be found in U.S. Pat. No. 5,493,391 to Neal and Michie; as well as U.S. Pat. No. 5,864,381 by Neal and Mansell. Both of these referenced U.S. Patents are commonly assigned to the present assignee, Sandia Corporation of Albuquerque, New Mexico.

The present invention can also comprise an electrically-switched optical modulator attached to the package. Alternatively, electrically-switched optical modulator can replace window 26, such as a lithium niobate window. In the example of a lithium niobate window, application of voltages around 5–6 V can switch the material from being transparent to being opaque, at a frequency of a few billion times per second. Such an active window can be used as a very fast shutter to control the amount of light being transmitted through window 26. More details about use of lithium niobate as a light modulation device can be found in U.S. Pat. No. 5,745,282 to Negi.

The particular examples discussed above are cited to illustrate particular embodiments of the invention. Other applications and embodiments of the apparatus and method of the present invention will become evident to those skilled in the art. For example, the electrically insulating plates with apertures can be replaced with open frames. The actual scope of the invention is defined by the claims appended hereto.

We claim:

1. A package having an integral window for packaging at least one microelectronic device, comprising:

a first electrically insulating plate comprising a multilayered material, having a first surface, an opposing second surface, and a first aperture disposed through said first plate;

an electrically conductive metallized trace disposed on the second surface of said first plate;

an integral window disposed across the first aperture and bonded to said first plate, for providing optical access to a microelectronic device disposed within said assembly; and a second electrically insulating plate having a third surface, an opposing fourth surface, and a second aperture disposed through said second plate;

an electrically conductive metallized trace disposed on the fourth surface of the second plate; and a third electrically insulating plate, attached to the fourth surface;

wherein the third plate includes a third aperture disposed through said third plate;

wherein the third aperture is larger than the second aperture;

wherein the first plate is attached to the second plate by joining the second surface to the third surface; and wherein the second aperture is larger than the first aperture.

2. The package of claim 1, wherein the window substantially fills the first aperture.

3. The package of claim 2, wherein the aperture-filling window is formed by casting a castable window material directly into the first aperture.

4. The package of claim 3, wherein the castable window material comprises molten glass that solidifies after casting.

5. The package of claim 3, wherein the castable window material comprises a liquid polymer that solidifies after casting.

6. The package of claim 1, wherein said window is bonded to the first surface.

7. The package of claim 1, wherein the geometry of the joint between the window and the first plate comprises an encased joint geometry.

8. The package of claim 1, wherein said window is bonded to a lip recessed inside of the first plate.

9. The package of claim 8, wherein said window is mounted flush with the first surface of the first plate.

10. The package of claim 1, wherein said window comprises an optically transparent material selected from the group consisting of glass, sapphire, fused silica, plastic, and polymer.

11. The package of claim 1, further comprising a surface treatment to improve wettability and adhesion of retiring surfaces.

12. The package of claim 1, wherein said window comprises an anti-reflection coating.

13. The package of claim 1, wherein said window comprises means for filtering selected wavelengths of light.

14. The package of claim 1, wherein said plates comprise a dielectric material selected from the group consisting of a ceramic, a polymer, a plastic, a glass, a glass-ceramic composite, a glass-polymer composite, a resin material, a fiber-reinforced composite, a glass-coated metal, a printed wiring board composition, and combinations thereof.

15. The package of claim 1, wherein said plates comprise a bulk ceramic material selected from the group consisting of alumina, beryllium oxide, silicon nitride, aluminum nitride, titanium nitride, titanium carbide, silicon carbide, and combinations thereof.

16. The package of claim 1, wherein the second plate comprises the same multilayered material as the first plate.

17. The package of claim 1, wherein the third plate comprises the same multilayered material as the first plate.

18. The package of claim 1, wherein said multilayered material comprises a high-temperature cofired ceramic multilayered material fired at a Ad temperature in the range of 1300 C. to 1800 C.

19. The package of claim 1, wherein said multilayered material comprises a low-temperature cofired ceramic multilayered material fired at a temperature in the range of 600 C to 1000 C.

20. The package of claim 1, wherein said multilayered material comprises a laminated multilayered printed wiring board composition.

21. The package of claim 1, further comprising a bonding material consisting of a material selected from the group consisting of a hermetic sealant and an adhesive.

22. The package of claim 1, further comprising a hermetic sealant selected from the group consisting of a braze alloy, a frit glass compound, a glass-ceramic composite, a glass-polymer compound, a ceramic-polymer compound, and a solder alloy.

23. The package of claim 1, further comprising an adhesive selected from the the group consisting of an epoxy resin, a polyimide adhesive, a silicone adhesive, and a urethane adhesive.

24. A sealed symmetric package having an integral window, comprising;
the package of claim 1; and
a second package substantially identical to the package of claim 1; wherein the package of claim 1; is inverted and bonded to the second package to form a sealed symmetric package.

25. A double-stacked package having an integral window, comprising;
the package of claim 1; and
a second package substantially identical to the package of claim 1; wherein the package of claim 1 is stacked on top of, and is bonded to, the second package to form a double-stacked package.

26. The package of claim 1, wherein said window further comprises a lens for optically transforming the light that passes through the window.

27. The package of claim 26, wherein said lens is attached to said window.

28. The package of claim 26, wherein said lens is integrally formed with said window.

29. The package of claim 26, further comprising an array of binary optic lenslets made integral with said window.

30. The package of claim 1, further comprising an electrically-switched optical modulator attached to said package, for modulating light passing through an aperture.

31. The package of claim 30, wherein said electrically-switched optical modulator comprises a lithium niobate window.

32. The package of claim 1, further comprising electrically conductive vias disposed within said electrically insulating plates, for conducting electrical signals in a direction generally perpendicular to the plane of said plates.

33. The package of claim 1, further comprising a microelectronic device mounted within said package.

34. The package of claim 33, wherein said microelectronic device is a device selected from the group consisting of a semiconductor chip, a CCD chip, a CMOS chip, a VCSEL chip, a laser diode, a MEMS device, and a IMEMS device.

35. The package of claim 34, wherein said microelectronic device is mounted to the second surface.

36. The package of claim 33, wherein said microelectronic device is flip-chip mounted to the second surface.

37. The package of claim 33, wherein said microelectronic device comprises a light-sensitive side.

38. The package of claim 37, wherein said light-sensitive side is mounted facing said window.

39. The package of claim 33, further comprising a cover lid bonded to the package, for covering and sealing said package.

40. The package of claim 39, wherein said cover lid comprises a window for providing optical access through the second aperture.

41. The package of claim 39, wherein the ambient air inside said package has been substantially removed and replaced with at least one gas other than air.

42. The package of claim 33, further comprising a seal disposed in-between said microelectronic device and the second surface.

43. The package of claim 1, further comprising a first microelectronic device, flip-chip mounted to the second surface; and a second microelectronic device, flip-chip mounted to the fourth surface.

44. The package of claim 43, further comprising a cover lid bonded to the package, for covering and sealing said package.

45. The package of claim 1, further comprising a first microelectronic device, flip-chip mounted to the second surface; and a second microelectronic device, bonded to the backside of said first device; wherein said second device is wirebonded to the fourth surface.

46. The package of claim 45, further comprising a cover lid bonded to the package; wherein said second device comprises a light-sensitive side; and wherein said second device is mounted with said light-sensitive side facing towards said cover lid, and further wherein said cover lid comprises a window for providing optical access to said light-sensitive side of said second device.

* * * * *